US010529862B2

(12) United States Patent
Liang et al.

(10) Patent No.: US 10,529,862 B2
(45) Date of Patent: Jan. 7, 2020

(54) SEMICONDUCTOR DEVICE AND METHOD OF FORMING SEMICONDUCTOR FIN THEREOF

(71) Applicant: TAIWAN SEMICONDUCTOR MANUFACTURING CO., LTD., Hsinchu (TW)

(72) Inventors: Chia-Ming Liang, Taipei (TW); Huai-Hsien Chiu, Taipei (TW); Yi-Shien Mor, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/410,839

(22) Filed: Jan. 20, 2017

(65) Prior Publication Data

US 2018/0151739 A1    May 31, 2018

Related U.S. Application Data

(60) Provisional application No. 62/426,801, filed on Nov. 28, 2016.

(51) Int. Cl.
*H01L 29/78* (2006.01)
*H01L 29/66* (2006.01)

(52) U.S. Cl.
CPC .... *H01L 29/7853* (2013.01); *H01L 29/66795* (2013.01)

(58) Field of Classification Search
CPC ........... H01L 29/7853; H01L 29/66795; H01L 29/0653
See application file for complete search history.

(56) References Cited

U.S. PATENT DOCUMENTS

| 7,547,637 | B2 * | 6/2009 | Brask | H01L 21/30608 |
| | | | | 438/717 |
| 8,071,983 | B2 * | 12/2011 | Brask | H01L 21/30608 |
| | | | | 257/66 |
| 8,742,509 | B2 * | 6/2014 | Lee | H01L 29/66795 |
| | | | | 257/368 |
| 9,006,805 | B2 * | 4/2015 | Liao | H01L 29/41791 |
| | | | | 257/288 |
| 9,105,660 | B2 * | 8/2015 | Tsai | H01L 29/66795 |
| 9,236,452 | B2 * | 1/2016 | Lim | H01L 29/66795 |
| 9,559,099 | B2 * | 1/2017 | Lee | H01L 27/0886 |
| 9,620,416 | B1 * | 4/2017 | Basker | H01L 21/823418 |
| 9,799,771 | B2 * | 10/2017 | Cheng | H01L 29/7853 |
| 2016/0372567 | A1 * | 12/2016 | Tak | H01L 29/6656 |
| 2017/0178961 | A1 * | 6/2017 | Ryu | H01L 21/02183 |
| 2017/0373064 | A1 * | 12/2017 | Chang | H01L 21/823821 |
| 2018/0175172 | A1 * | 6/2018 | Chang | H01L 29/045 |

* cited by examiner

*Primary Examiner* — William Coleman
(74) *Attorney, Agent, or Firm* — McClure, Qualey & Rodack, LLP

(57) ABSTRACT

A semiconductor device includes a substrate, an epitaxial channel structure and a gate structure. The epitaxial channel structure is located above the substrate. The epitaxial channel structure has a bottom and a top. The bottom is between the substrate and the top, and the bottom has a width less than that of the top.

20 Claims, 10 Drawing Sheets

SEMICONDUCTOR DEVICE AND METHOD OF FORMING SEMICONDUCTOR FIN THEREOF

PRIORITY CLAIM AND CROSS-REFERENCE

This application claims priority to U.S. Provisional Application Ser. No. 62/426,801, filed Nov. 28, 2016, which is herein incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A FinFET includes a thin vertical "fin" (or fin structure) formed in a free standing manner over a major surface of a substrate. The channel of the FinFET is formed in this vertical fin. A gate is provided over the fin. Having a gate on both sides of the channel allows gate control of the channel from both sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
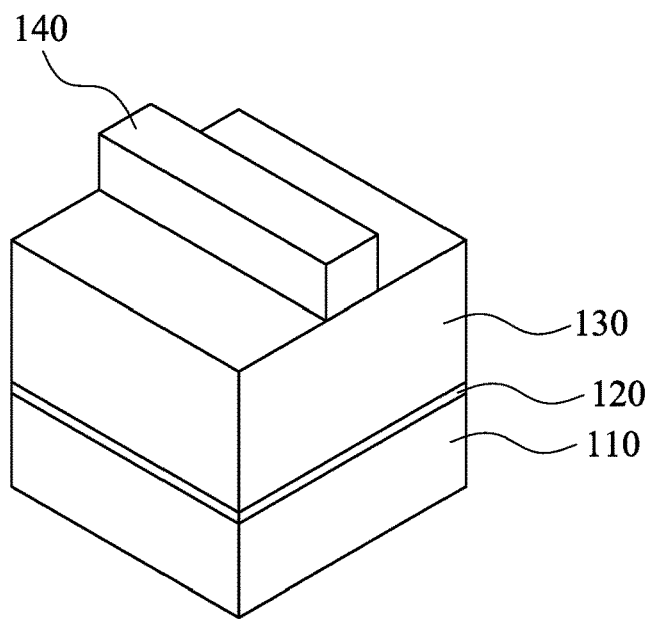
FIG. 1 to FIG. 18 illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 18 illustrate a method for manufacturing a semiconductor device at various stages in accordance with some embodiments of the present disclosure. Reference is made to FIG. 1. Substrate 110 is illustrated, and it may be a semiconductor substrate, such as a bulk semiconductor, a semiconductor-on-insulator (SOI) substrate, or the like. The substrate 110 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 110 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A pad layer 120 and a mask layer 130 are formed on the substrate 110. The pad layer 120 may be a thin film comprising silicon oxide formed using, for example, a thermal oxidation process. The pad layer 120 may act as an adhesion layer between the substrate 110 and mask layer 130. The pad layer 120 may also act as an etch stop layer for etching the mask layer 130. In some embodiments, the mask layer 130 is formed of silicon nitride, for example, using low-pressure chemical vapor deposition (LPCVD) or plasma enhanced chemical vapor deposition (PECVD). The mask layer 130 is used as a hard mask during subsequent photolithography processes. The mask layer 130 has a thickness great enough to benefit formation of a tapered opening in shallow trench isolation (STI) in subsequent processes. A photo-sensitive layer 140 is formed on the mask layer 130 and is then patterned, forming openings in the photo-sensitive layer 140, so that some regions of the mask layer 130 are exposed.

Figure 2:
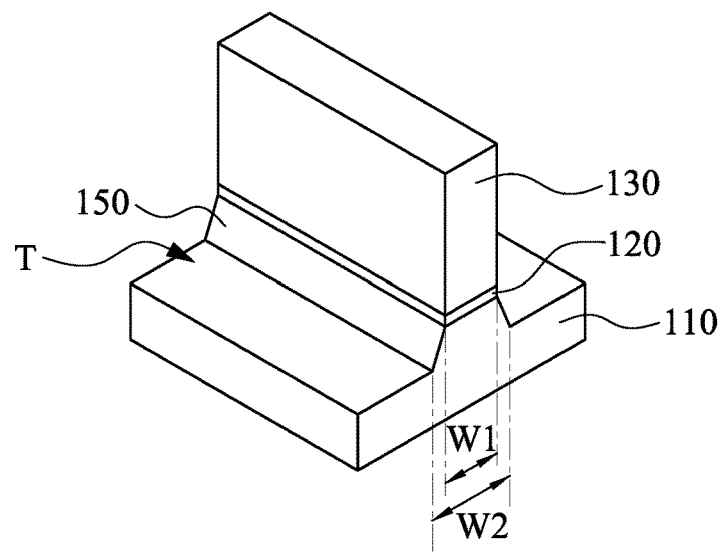

Reference is made to FIG. 2. The mask layer 130 and pad layer 120 are etched through the photo-sensitive layer 140, exposing underlying substrate 110. The exposed substrate 110 is then etched, forming trenches T. Portion of the substrate 110 between neighboring trenches T forms fin-shaped structure 150. The fin-shaped structure 150 can also be referred to as a semiconductor fin, and the remaining mask layer 130 can be referred to as a dielectric cap that caps the fin-shaped structure 150 in some embodiments. Etching the substrate 110 may include anisotropic etching. In some exemplary embodiments, sidewalls of the fin-shaped structure 150 have (110) planes. Trenches T may be trench strips that are parallel to each other. Depth of the trench T may be between about 200 Å and about 1,000 Å. The fin-shaped structure 150 may be a tapered structure due to the anisotropic etching. In particular, the fin-shaped structure 150 may taper in a direction away from the substrate 110. For example, the fin-shaped structure 150 has a top width W1 and a bottom width W2, and the top width W1 is less than the bottom width W2. After etching the substrate 110, the photo-sensitive layer 140 is removed. Next, a cleaning step may be performed to remove a native oxide of the semiconductor substrate 110. The cleaning may be performed using diluted hydrofluoric (HF) acid, for example.

Figure 3:
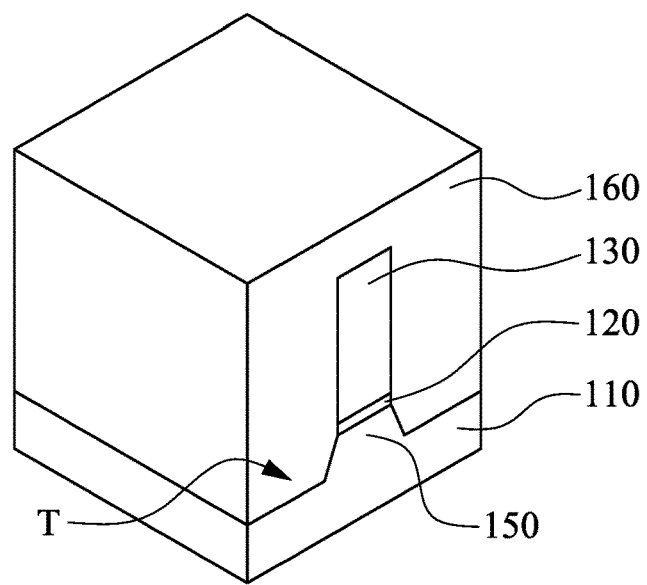

After photo-sensitive layer 140 is removed, isolation dielectric 160 is formed to cover the fin-shaped structure 150 over substrate 110, the isolation dielectric 160 may overfill the trenches T, and the resulting structure is shown in FIG. 3. The isolation dielectric 160 in the trenches T can be referred to as shallow trench isolation (STI). In some embodiments, the isolation dielectric 160 is made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation dielectric 160 may be formed using a sub-atmospheric CVD (SACVD) process or high aspect-ratio process (HARP), wherein process gases may comprise tetraethylorthosilicate (TEOS) and ozone ($O_3$). In yet other embodiments, the isolation dielectric 160 may be formed using a spin-on-dielectric (SOD) process, such as hydrogen silsesquioxane (HSQ) or methyl silsesquioxane (MSQ). Other processes and materials may be used. In some embodiments, the isolation dielectric 160 can have a multi-layer structure, for example, a thermal oxide liner layer with silicon nitride formed over the liner. Thereafter, a thermal annealing may be optionally performed to the isolation dielectric 160.

Figure 4:
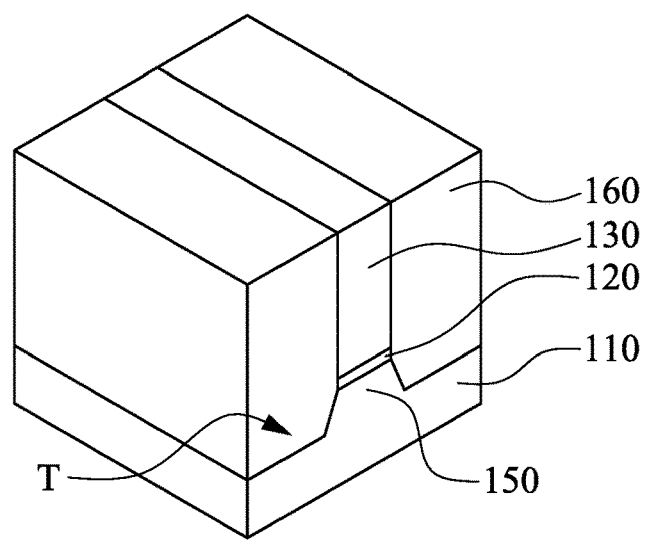

Next, a planarization such as chemical mechanical polish (CMP) is then performed, as shown in FIG. 4, and hence isolation dielectric 160 remaining on opposite sides of the mask layer 130 may have top surface substantially level with that of mask layer 130. The mask layer 130 may be used as the CMP stop layer in the planarization. After the CMP, the remaining isolation dielectric 160 may be located beside the mask layer 130.

Figure 5:
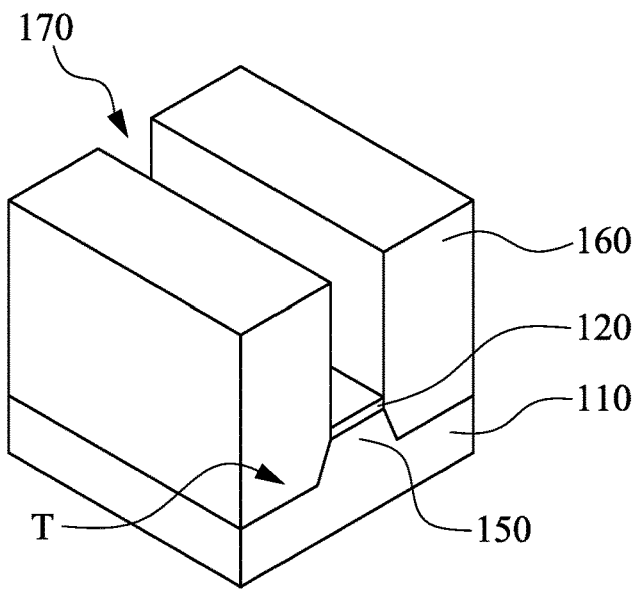

Reference is made to FIG. 5. An etching operation is performed to remove the mask layer 130 to form an opening 170 in the isolation dielectric 160, and the pad layer 120 is exposed at bottom of the opening 170. In other words, the pad layer 120 remains atop the fin-shaped structure 150 and thus acts as an etch stop layer for etching the mask layer 130. The mask layer 130, if formed of silicon nitride, may be removed by a wet process using etchant such as hot $H_3PO_4$. The pad layer 120 and the isolation dielectric 160 are made of materials different from that of the mask layer 130. The pad layer 120 and the isolation dielectric 160 have higher etch resistance to the etchant used to etch the opening 170 than that of the mask layer 130. Therefore, the opening 170 has geometry substantially the same as that of the mask layer 130. In other words, the geometry of the opening 170 to be expanded as a tapered opening 175 (see FIG. 6) can be determined by the removed mask layer 130. Therefore, it may be beneficial to form the mask layer 130 with a thickness sufficient to make the opening 170 deep enough to be subsequently expanded as the tapered opening 175.

Figure 6:
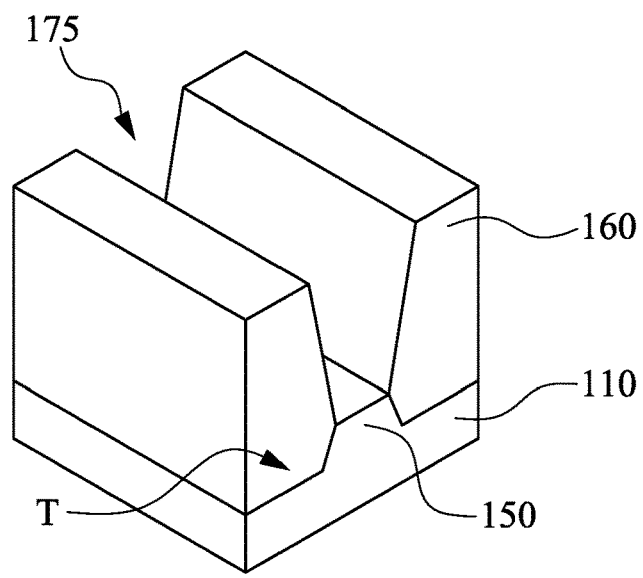

The opening 170 is expanded to form the tapered opening 175 in the isolation dielectric 160, and the resulting structure is shown in FIG. 6. The tapered opening 175 tapers in a direction toward the fin-shaped structure 150 and/or the substrate 110. Stated differently, top width of the tapered opening 175 is greater than bottom width of the tapered opening 175. For example, the tapered opening 175 has a shape of an inverted trapezoid. Formation of the tapered opening 175 includes one or more etching processes, such as wet etching, dry etching, or combinations thereof, which laterally etch inner sidewalls of the opening 170 to expand the opening 170. For example, portion of the isolation dielectric 160 around the opening 170, if formed of silicon oxide, may be removed by a wet process using etchant such as diluted HF, which is different from the etchant used to etching the previously removed mask layer 130. Geometry of the inverted trapezoidal opening 175 can be determined by etch parameters of the etching process for expanding the opening 170. In some embodiments where the pad layer 120 is made of oxide, the pad layer 120 may be removed during expanding the opening 170. That is, removal of the pad layer 120 and expanding of the opening 170 may be achieved by the same etching. This is due to that the pad layer 120 and the isolation dielectric 160 may have substantially the same material in some embodiments. Removal of the pad layer 120 may expose a top of the fin-shaped structure 150 to a subsequent epitaxy process.

Figure 7:
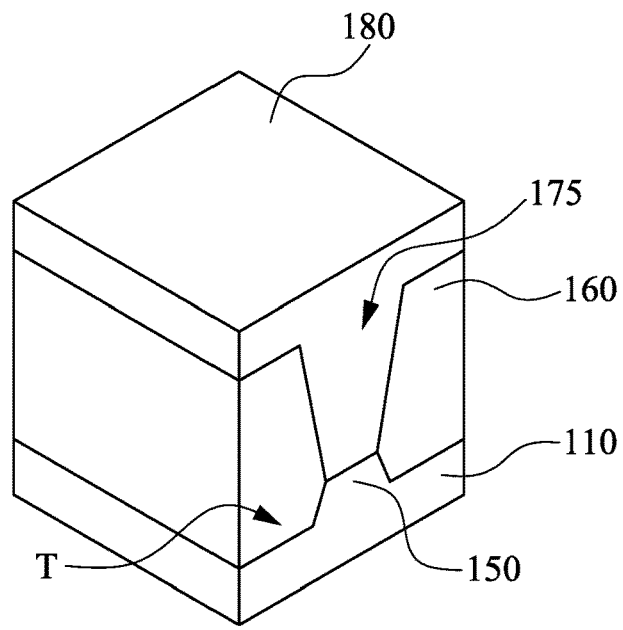

Reference is made to FIG. 7. Epitaxial structure 180 is epitaxially grown in the tapered opening 175 such that semiconductor material can be formed in a crystalline state on the fin-shaped structure 150. The epitaxial structure 180 may overfill the tapered opening 175. The epitaxial structure 180 can be a homoepitaxial structure according to some embodiments. For example, in some embodiments where the fin-shaped structure 150 is made of silicon, silicon can be epitaxially grown in the tapered opening 175. In other words, the epitaxial structure 180 and the fin-shaped structure 150 can have substantially the same material. The epitaxial structure 180 can be a heteroepitaxial structure according to some other embodiments. For example, in some embodiments where the fin-shaped structure 150 is made of silicon, a material different from silicon can be epitaxially grown in the tapered opening 175. In some embodiments, the epitaxial structure 180 may include, for example, silicon, silicon germanium ($Si_xGe_{1-x}$, where x can be between approximately 0 and 100), silicon phosphate, silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The epitaxial growth includes CVD deposition techniques (e.g., vapor-phase epitaxy (VPE), low-pressure chemical vapor deposition (LPCVD) and/or ultra-high vacuum CVD (UHV-CVD)), molecular beam epitaxy, and/or other suitable processes. The epitaxial growth may use gaseous and/or liquid precursors, which interact with the composition of the fin-shaped structure 150 (e.g., silicon).

Figure 8:
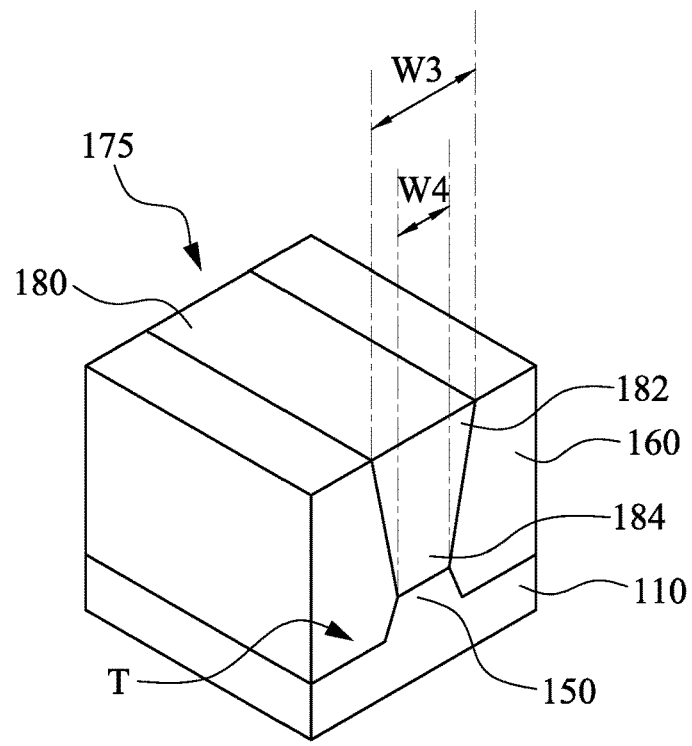

Next, as shown in FIG. 8, CMP can be performed to remove excess portion of epitaxial structure 180 outside the tapered opening 175, such that the remaining portion of epitaxial structure 180 has a top surface substantially level with that of the isolation dielectric 160. The remaining epitaxial structure 180 sits atop the fin-shaped structure 150, and they can be collectively referred to as a semiconductor fin protruding from the substrate 110 in some embodiments. The fin-shaped structure 150 can be referred to as a bottom portion of the semiconductor fin, and the epitaxial structure 180 can be referred to as an epitaxial portion atop the bottom portion. The epitaxial structure 180 fills the tapered opening 175, and hence the epitaxial structure 180 has geometry substantially the same as that of the tapered opening 175. For example, the epitaxial structure 180 has a top 182 and a bottom 184. The top and bottom 182 and 184 respectively have top and bottom widths W3 and W4. The bottom width W4 is less than the top width W3. In some embodiments, the epitaxial structure 180 tapers in the direction toward the fin-shaped structure 150 and/or the substrate 110. Alternatively stated, the epitaxial structure 180 has a shape of an inverted trapezoid, which is substantially the same as the shape of the tapered opening 175. The inverted trapezoidal epitaxial structure 180 may provide a suitable channel profile for improving the device performance and mitigating short channel effects, which will be discussed in detail later. In some embodiments where the fin-shaped structure 150 tapers in the direction away from the substrate 110, the epitaxial structure 180 and the fin-shaped structure 150 may respectively taper in opposite directions. Stated differently, the fin-shaped structure 150 is a trapezoidal strip, and the epitaxial structure 180 is an inverted trapezoidal strip atop the trapezoidal strip. This is due to that the fin-shaped structure 150 is shaped by etching the shallow trenches T beside the fin-shaped structure 150, and the epitaxial structure 180 is shaped by etching the tapered opening 175 above the fin-shaped structure 150.

Figure 9:
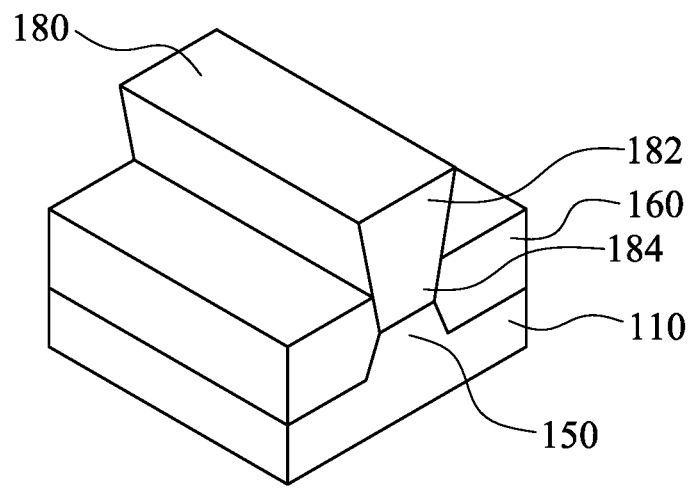

Reference is made to FIG. 9. The isolation dielectric 160 is recessed, for example, through an etching operation, wherein diluted HF, SiCoNi (including HF and $NH_3$), or the like, may be used as the etchant. After recessing the isolation dielectric 160, portion of the inverted trapezoidal epitaxial structure 180 is higher than top surface of the isolation dielectric 160. In other words, this portion of the inverted trapezoidal epitaxial structure 180 protrudes above the isolation dielectric 160, and another portion of the inverted trapezoidal epitaxial structure 180 is embedded in the isolation dielectric 160.

Figure 10:
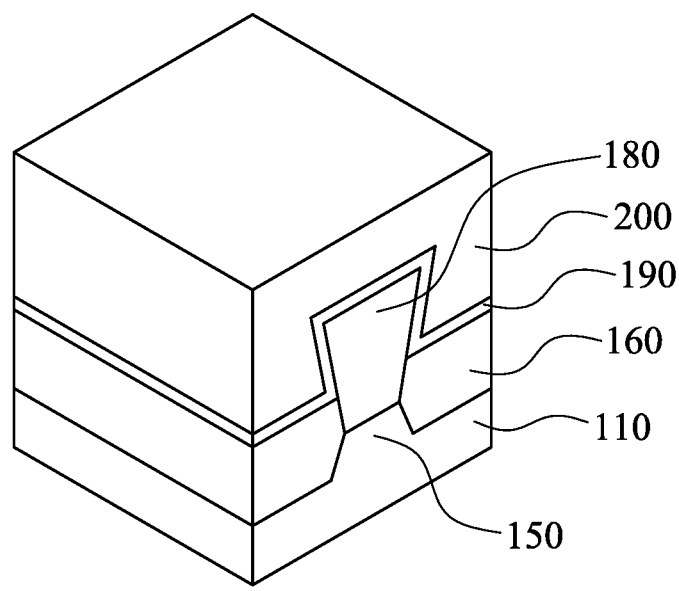

Reference is made to FIG. 10. A gate dielectric layer 190 is blanket formed over substrate 110 to cover the inverted trapezoidal epitaxial structure 180 and the isolation dielectric 160. In some embodiments, gate dielectric layer 190 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layer 190 is an oxide layer. Gate dielectric layer 190 may be formed by a deposition processes, such as chemical vapor deposition (CVD), physical vapor deposition (PVD), atomic layer deposition (ALD), plasma enhanced CVD (PECVD) or other suitable techniques.

After the gate dielectric layer 190 is formed, a gate electrode layer 200 is formed over the gate dielectric layer 190, as shown in FIG. 10 in accordance with some embodiments. In some embodiments, the gate electrode layer 200 may include polycrystalline-silicon (poly-Si), poly-crystalline silicon-germanium (poly-SiGe), metallic nitrides, metallic silicides, metallic oxides, or metals. In some embodiments, the gate electrode layer 200 includes a metal-containing material such as TiN, TaN, TaC, Co, Ru, Al, combinations thereof, or multi-layers thereof. The gate electrode layers may be deposited by CVD, physical vapor deposition (PVD), sputter deposition, or other techniques suitable for depositing conductive materials.

Figure 11:
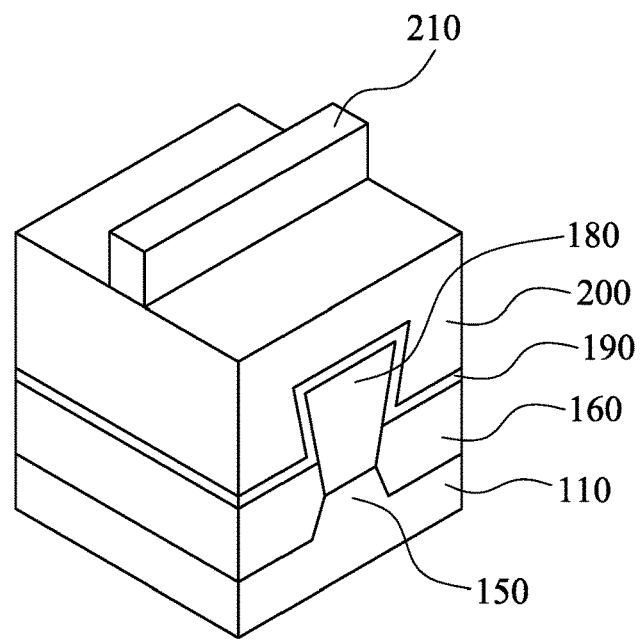

Next, the gate electrode layer 200 and gate dielectric layer 190 are patterned to form a gate structure in accordance with some embodiments. For example, a mask 210 is formed over a portion of gate electrode layer 200, as shown in FIG. 11 in accordance with some embodiments. The mask 210 may be a hard mask for protecting underlying gate electrode layer 200 and gate dielectric layer 190 during subsequent etching process. The mask 210 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

Figure 12:
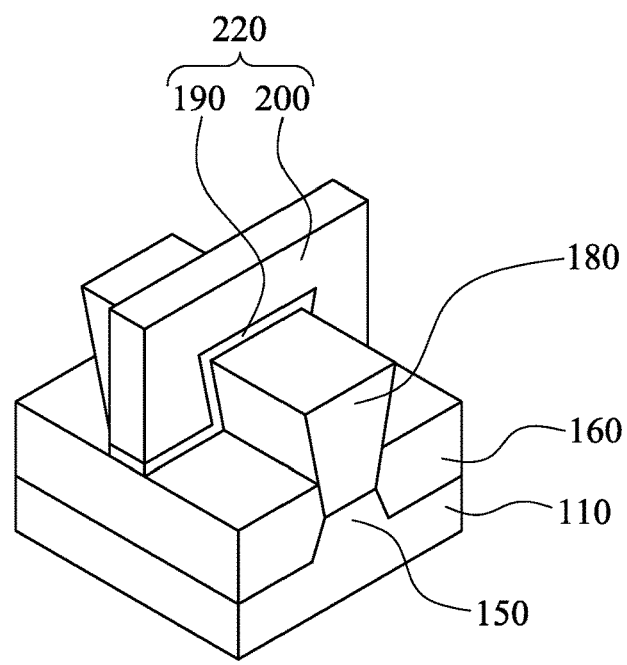

After the mask 210 is formed, an etching process is performed to form a gate structure 220 wrapping a portion of the inverted trapezoidal epitaxial structure 180, and the mask 210 is removed after the etching, and the resulting structure is shown in FIG. 12. The gate structure 220 includes portions of the gate electrode layer 200 and gate dielectric layer 190 underlying the mask 210. A central portion of the inverted trapezoidal epitaxial structure 180 can be wrapped by the gate structure 220. The gate structure 220 has a longitudinal axis substantially perpendicular to that of the inverted trapezoidal epitaxial structure 180. Moreover, the gate structure 220 may cross over a plurality of substantially parallel tapered semiconductor structures 180 (this arrangement is not shown). In some embodiments, the gate structure 220 is a dummy gate structure and will be replaced with a replacement gate structure using a "gate-last" or replacement-gate process. In other embodiments, the gate structure 220 is an active gate and is formed in a "gate-first process" and will not be replaced.

Figure 13:
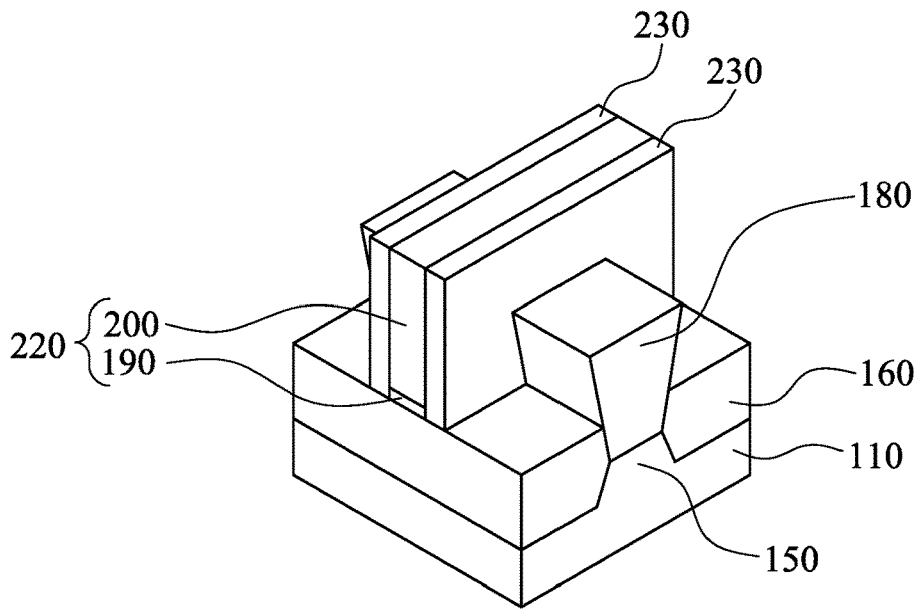

Reference is made to FIG. 13. Gate spacers 230 are formed on opposite sidewalls of the gate structure 220. In some embodiments, the gate spacers 230 may include silicon oxide, silicon nitride, silicon oxynitride, silicon carbide, silicon carbonitride, silicon oxycarbonitride, silicon oxycarbide, porous dielectric materials, hydrogen doped silicon oxycarbide (SiOC:H), low-k dielectric materials or other suitable dielectric material. The gate spacers 230 may include a single layer or multilayer structure made of different dielectric materials. The method of forming the gate spacers 230 includes blanket forming a dielectric layer on the structure shown in FIG. 12 using, for example, CVD, PVD or ALD, and then performing an etching process such as anisotropic etching to remove a portion of the dielectric layer. The remaining portions of the dielectric layer on sidewalls of the gate structure 220 can serve as the gate spacers 230. In some embodiments, the gate spacers 230 may be used to offset subsequently formed doped regions, such as source/drain regions. The gate spacers 230 may further be used for designing or modifying the source/drain region profile.

Figure 14:
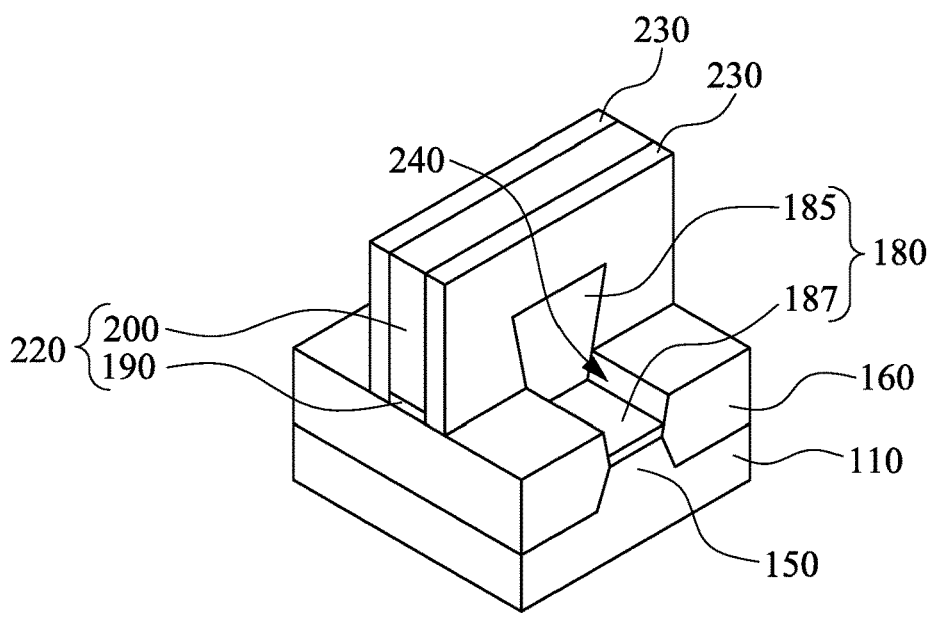

Reference is made to FIG. 14. Portions of the inverted trapezoidal epitaxial structure 180 exposed by the gate structure 220 and the gate spacers 230 are respectively partially removed (or partially recessed) to form recesses 240. The recesses 240 may have a shape of an inverted trapezoid. This is due to that the recesses 240 are formed by removing portions of the inverted trapezoidal epitaxial structure 180 embedded in isolation dielectric 160. In other words, after the removal, the recesses 240 formed in the isolation dielectric 160 taper in the direction toward the fin-shaped structure 150 and/or the substrate 110. The remaining inverted trapezoidal epitaxial structure 180 may have embedded portions 187 and a protruding portion 185 after this removal. The embedded portions 187 are embedded in the isolation dielectric 160, and the embedded portions 187 are at least partially exposed by the recesses 240, respectively. The protruding portion 185 protrudes from the embedded portions 187 and adjacent to the recesses 240. The gate structure 220 and the gate spacers 230 wrap the protruding portion 185, and opposite sidewalls of the protruding portion 185 are respectively exposed by the gate spacers 230. A portion of the protruding portion 185 wrapped by the gate structure 220 can be referred to as a channel portion or an epitaxial channel structure in some embodiments.

Formation of the recesses 240 may include a dry etching process, a wet etching process, or combination dry and wet etching processes. This etching process may include reactive ion etch (RIE) using the gate structure 220 and gate spacers 230 as masks, or by any other suitable removal process. In some embodiments, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow good control of an etching direction to achieve predetermined profiles for the embedded portions 187 of inverted trapezoidal epitaxial structure 180. Because the protruding portion 185 is protected by the overlying gate structure 220 and gate spacers 230 during etching the recesses 240, the protruding portion 185 remains in the shape of the inverted trapezoid. Alternatively stated, the epitaxial channel structure wrapped by the gate structure 220 remains in the shape of the inverted trapezoid, which tapers in the direction toward the underlying fin-shaped structure 150 and substrate 110. After the etching process, a precleaning process may be performed to clean the recesses 240 with hydrofluoric acid (HF) or other suitable solution in some embodiments.

In the depicted embodiments, portions of the inverted trapezoidal epitaxial structure 180 remain under the recesses 240 as the embedded portions 187. In some other embodiments, the inverted trapezoidal epitaxial structure 180 is absent under the recess 240. That is, formation of the recesses 240 may expose the fin-shaped structure 150.

Figure 15:
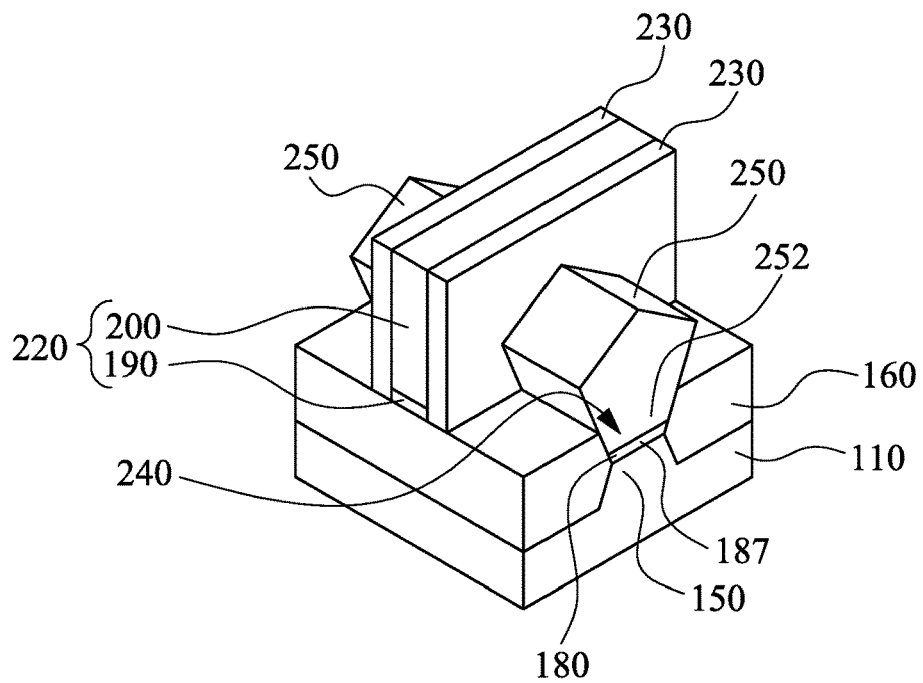

Reference is made to FIG. 15. Epitaxial source/drain structures 250 are respectively formed in the inverted trapezoidal recesses 240. The inverted trapezoidal recesses 240 can also be referred to as inverted trapezoidal openings defined by the isolation dielectric 160 to receive at least portions of the epitaxial source/drain structures 250. The epitaxial source/drain structures 250 may be formed using one or more epitaxy or epitaxial (epi) processes, such that Si features, SiGe features, silicon phosphate (SiP) features, silicon carbide (SiC) features and/or other suitable features can be formed in a crystalline state on the embedded portion 187 of the inverted trapezoidal epitaxial structure 180. The epitaxial source/drain structures 250 have embedded source/drain portions 252 that are embedded in the isolation dielectric 160. The recesses 240 receive the embedded source/drain portions 252, respectively. For example, the embedded source/drain portions 252 are embeddedly retained in the respective recesses 240. Therefore, the embedded source/drain portions 252 may taper in the direction toward the trapezoidal fin-shaped structure 150 and/or the substrate 110. Stated differently, the embedded source/drain portions 252 may have shapes of inverted trapezoids. In some embodiments, upper portions of the isolation dielectric 160 abut the embedded source/drain portions 252, and these upper portions of the isolation dielectric 160 tapers in the direction away from the substrate 110. In some embodiments, lattice constants of the epitaxial source/drain structures 250 are different from that of the inverted trapezoidal epitaxial structure 180, so that the epitaxial channel structure between the epitaxial source/drain structures 250 can be strained or stressed by the epitaxial source/drain structures 250 to improve carrier mobility of the semiconductor device and enhance the device performance.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the inverted trapezoidal epitaxial structure 180 (e.g., silicon, silicon germanium, silicon phosphate, or the like). The epitaxial source/drain structures 250 may be in-situ doped. The doping species include P-type dopants, such as boron or $BF_2$; N-type dopants, such as phosphorus or arsenic; and/or other suitable dopants including combinations thereof. If the epitaxial source/drain structures 250 are not in-situ doped, a second implantation process (i.e., a junction implant process) is performed to dope the epitaxial source/drain structures 250. One or more annealing processes may be performed to activate the epitaxial source/drain structures 250. The annealing processes include rapid thermal annealing (RTA) and/or laser annealing processes.

Figure 16:
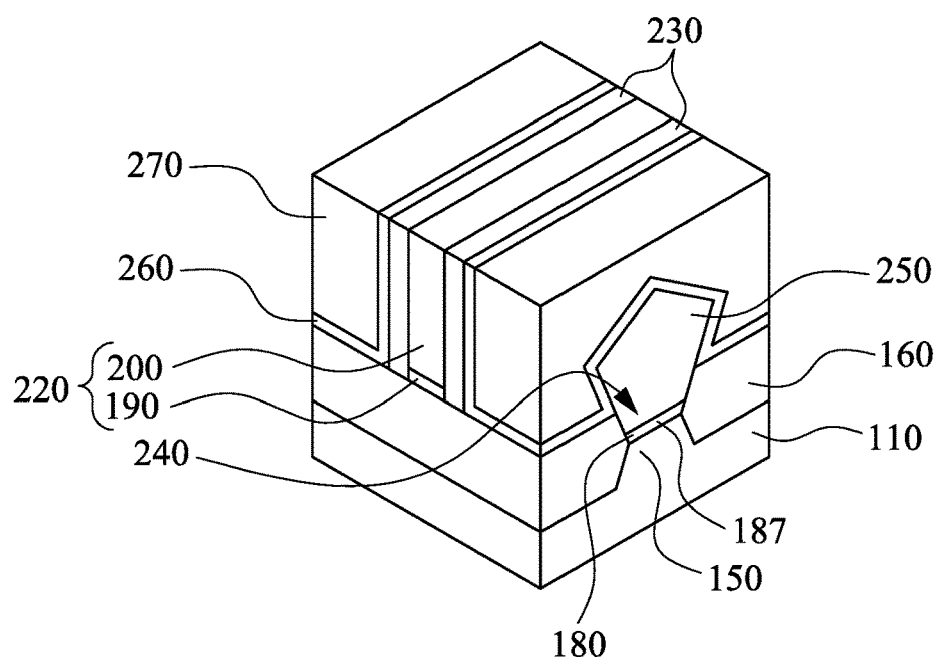

Reference is made to FIG. 16. Contact etch stop layer (CESL) 260 is blanket formed on the structure shown in FIG. 15, and then, interlayer dielectric (ILD) layer 270 is formed on the CESL 260. Afterwards, a CMP process may be performed to remove excessive material of the ILD layer 270 and the CESL 260 to expose the gate electrode layer 200 to a subsequent dummy gate removal process. The CMP process may planarize a top surface of the ILD layer 270 with top surfaces of the gate electrode layer 200, gate spacers 230 and the CESL 260 in some embodiments. The CESL 260 includes silicon nitride, silicon oxynitride or other suitable materials. The CESL 260 can be formed using, for example, plasma enhanced CVD, low pressure CVD, ALD or other suitable techniques. The ILD layer 270 may include a material different from the CESL 260. In some embodiments, the ILD layer 270 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 270 may be formed using, for example, CVD, ALD, spin-on-glass (SOG) or other suitable techniques.

Figure 17:
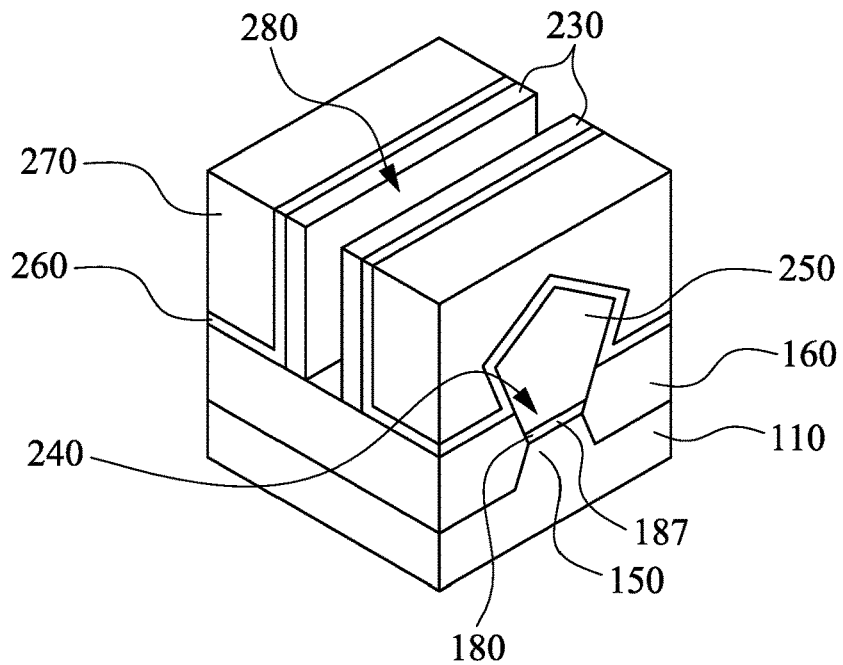

Next, the dummy gate structure 220 is removed to form a gate trench 280 with the gate spacers 230 as its sidewalls, and the resulting structure is shown in FIG. 17. In some embodiments, the dummy gate structure 220 is removed by performing a first etching process and performing a second etching process after the first etching process. In some embodiments, the gate electrode layer 200 is mainly removed by the first etching process, and gate dielectric layer 190 is mainly removed by the second etching process. In some embodiments, the first etching process is a dry etching process and the second etching process is a wet etching process. In some embodiments, the dry etching process includes using an etching gas such as $CF_4$, Ar, $NF_3$, $Cl_2$, He, HBr, $O_2$, $N_2$, $CH_3F$, $CH_4$, $CH_2F_2$, or combinations thereof. In some embodiments, the dry etching process is performed at a temperature in a range from about 20° C. to about 80° C. In some embodiments, the dry etching process is performed at a pressure in a range from about 1 mTorr to about 100 mTorr. In some embodiments, the dry etching process is performed at a power in a range from about 50 W to about 1500 W.

Figure 18:
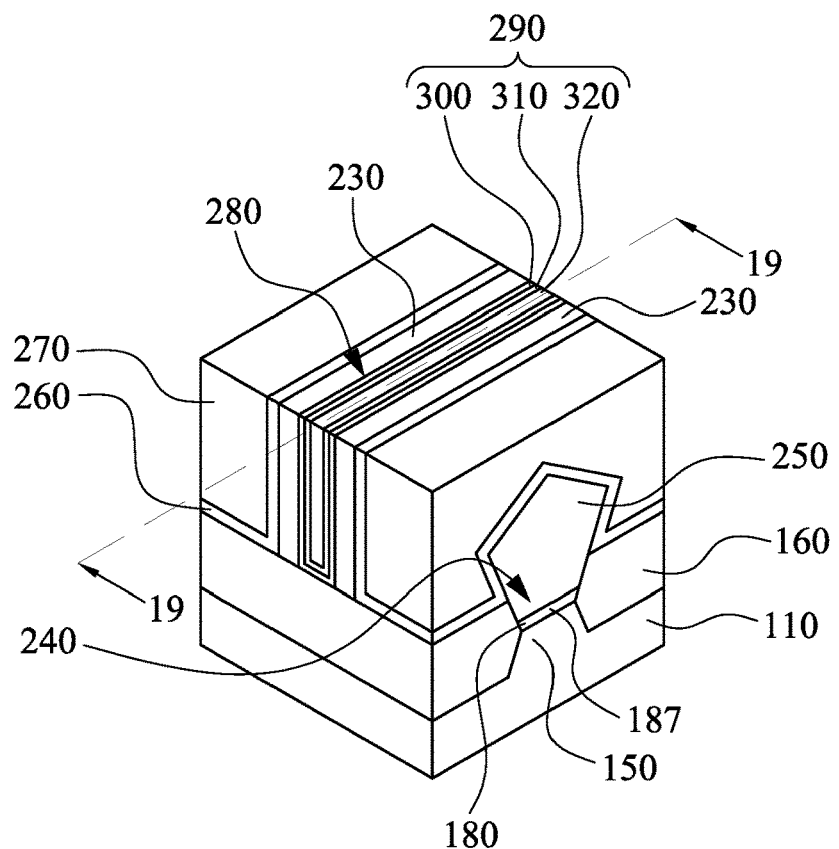
Figure 19:
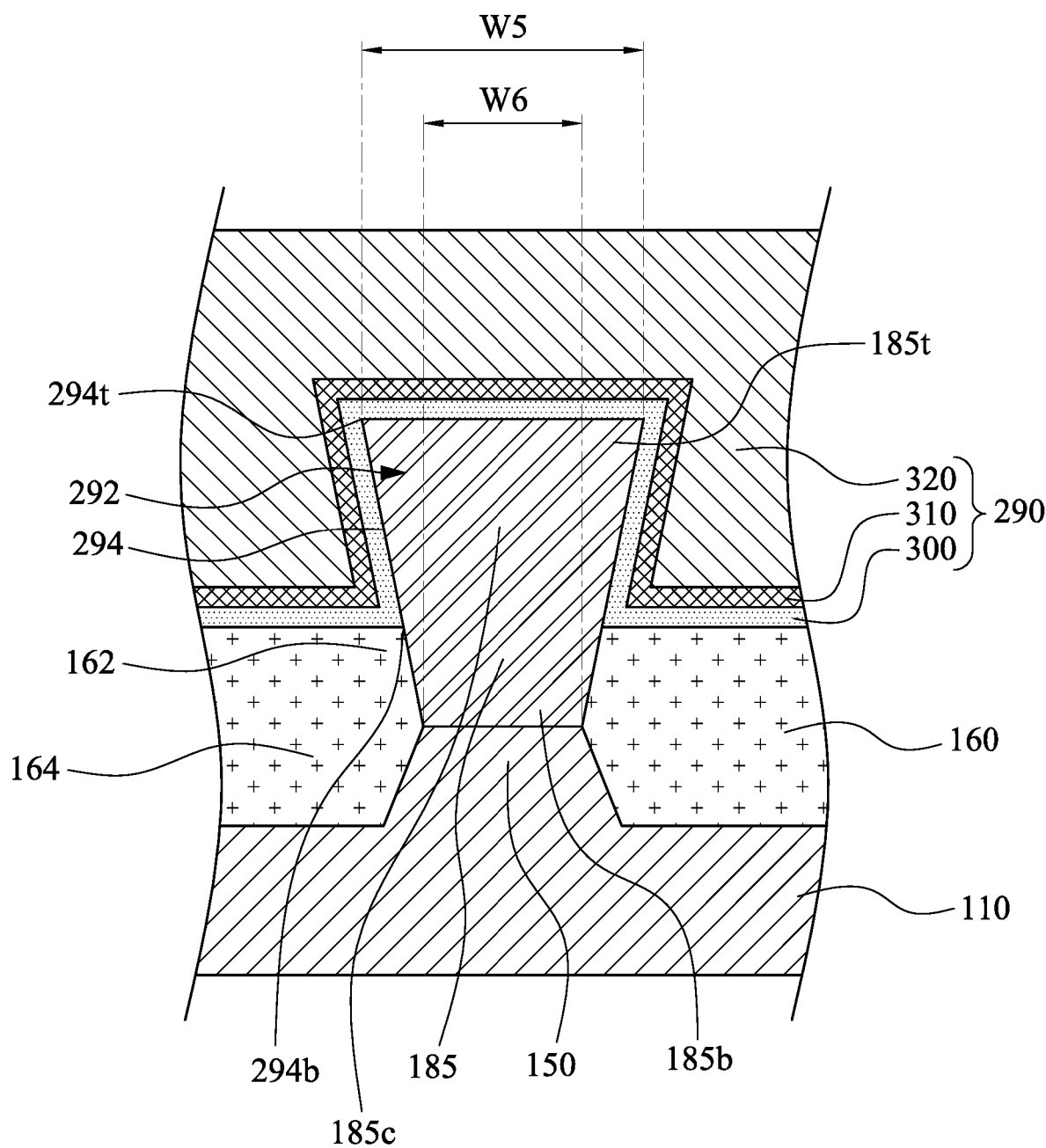
FIG. 19 is a cross-sectional view of a semiconductor device taken along line 19 in FIG. 18.

Reference is made to FIG. 18. Gate structure 290 is formed in the gate trench 280. The gate structure 290 straddles across the inverted trapezoidal epitaxial structure 180 and extends along the gate spacers 230. FIG. 19 is a cross-sectional view of a semiconductor device taken along line 19 in FIG. 18. As shown in FIG. 19, the protruding portion 185 wrapped by the gate structure 290 can be referred to as the epitaxial channel structure 185c. As illustrated, the epitaxial channel structure 185c has opposite top and bottom 185t and 185b, the top and bottom 185t and 185b respectively have top and bottom widths W5 and W6, and the bottom width W6 is less than the top width W5. In other words, the epitaxial channel structure 185c has top 185t wider than bottom 185b. The relatively wide top 185t can improve the device performance, such as increasing on-current (Ion) of the device. This is due to that the relatively wide top 185t can provide larger channel region for the semiconductor device. The relatively narrow bottom 185b can mitigate some short channel effects, such as drain-induced barrier lowering (DIBL). This is due to that the channel region affected by the depletion region when the device is in on-state may be reduced. Therefore, such an epitaxial channel structure 185c may be advantageous to either improve device performance or mitigate short channel effects.

In some embodiments, as shown in FIG. 19, the epitaxial channel structure 185c tapers in the direction toward the underlying fin-shaped structure 150 and/or the substrate 110. More particularly, the epitaxial channel structure 185c has a shape of an inverted trapezoid. This inverted trapezoidal channel structure 185c is located atop the trapezoidal fin-shaped structure 150. In other words, the epitaxial channel structure 185c and the fin-shaped structure 150 respectively taper in opposite directions.

The gate structure 290 has recess 292 receiving the epitaxial channel structure 185c, so that the epitaxial channel structure 185c can be wrapped by the gate structure 290. The epitaxial channel structure 185c is at least partially embeddedly retained in the recess 292 of the gate structure 290, and hence the epitaxial channel structure 185c and the recess 292 may have substantially the same geometry in some embodiments. As such, the recess 292 of the gate structure 290 may taper in the direction toward the fin-shaped structure 150 and/or the substrate 110. For example, the recess 292 may have a shape of an inverted trapezoid, and the inverted trapezoidal channel structure 185c is at least partially embedded retained in the inverted trapezoidal recess 292 of the gate structure 290.

In some embodiments, the gate structure 290 includes a pair of inner sidewalls 294. The epitaxial channel structure 185c is present between the inner sidewalls 294, so that the epitaxial channel structure 185c can be wrapped by the gate structure 290. The inner sidewalls 294 define the inverted trapezoidal recess 292 therebetween, and therefore, the inner sidewalls 294 are sloped. In particular, the inner sidewalls 294 have bottom edges 294b proximal to the substrate 110 and top edges 294t distal to the substrate 110, and a distance between the top edges 294t is greater than that between the bottom edges 294b. As such, the sloped inner sidewalls 294 can define the inverted trapezoidal recess 292 therebetween to receive the inverted trapezoidal epitaxial channel structure 185c.

The gate structure 290 may include a gate dielectric 300, a work function conductor 310 on the gate dielectric 300 and a filling conductor 320 on the work function conductor 310, in which the work function conductor 310 and the filling conductor 320 can be collectively referred to as gate conductor. The gate dielectric 300 is conformally formed on the inverted trapezoidal channel structure 185c, and hence the gate dielectric 300 may have a recess (e.g. recess 292) in which the inverted trapezoidal channel structure 185c is embeddedly retained, and this recess is an inverted trapezoidal recess that tapers in the direction toward the fin-shaped structure 150 and/or the substrate 110. Similarly, the gate conductor, including the work function conductor 310 and the filling conductor 320, is conformally formed on the gate dielectric 300, and therefore, the gate conductor may also have an inverted trapezoidal recess (e.g. recess 292) that tapers in the direction toward the fin-shaped structure 150 and/or the substrate 110. The inverted trapezoidal channel structure 185c can be thus embeddedly retained in the recess of the gate conductor.

In some embodiments, the gate dielectric 300 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof. In some embodiments, the gate dielectric 300 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof. In alternative embodiments, the gate dielectric 300 may have a multilayer structure such as one layer of silicon oxide (e.g., interfacial layer) and another layer of high-k material.

The work function conductor 310 may include work function metals to provide a suitable work function for the gate structure 290. In some embodiments, the work function conductor 310 may include one or more n-type work function metals (N-metal) for forming an n-type transistor on the substrate 110. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductor 310 may include one or more p-type work function metals (P-metal) for forming a p-type transistor on the substrate 110. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The filling conductor 320 fills a recess in the work function conductor 310. The filling conductor 320 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Exemplary method of forming the gate structure 290 may include blanket forming a gate dielectric layer over the structure shown in FIG. 17, forming one or more work function conductor layers over the blanket gate dielectric layer, forming a filling conductor layer over the work function conductor layers, wherein some portions of these deposited materials overfill the gate trench 280 shown in FIG. 17, and performing a CMP process to remove excessive materials of the filling conductor layer, work function conductor layers and gate dielectric layer outside the gate trench 280.

As shown in FIG. 19, the isolation dielectric 160 includes a lower isolation dielectric 164 and an upper isolation dielectric 162 overlying the lower isolation dielectric 164. The upper isolation dielectric 162 abuts the epitaxial channel structure 185c, and the lower isolation dielectric 164 abuts the fin-shaped structure 150. As such, the upper and lower isolation dielectrics 162 may respectively taper in opposite directions. More particularly, the upper isolation dielectric 162 abutting the inverted trapezoidal channel structure 185c may taper in the direction toward the substrate 110, and the lower isolation dielectric 164 abutting the trapezoidal fin-shaped structure 150 may taper in the direction away from the substrate 110.

Embodiments of the present disclosure provide at least following advantages. Top of the epitaxial channel structure is wide enough to improve device performance, such as increasing on-current (Ion) of the device, and bottom of the epitaxial channel structure is narrow enough to mitigate some short channel effects, such as drain-induced barrier lowering (DIBL). In other words, inverted trapezoidal epitaxial channel structure may be advantageous to either improve device performance or mitigate short channel effects. Moreover, geometry of the inverted trapezoidal epitaxial channel structure is determined by expanding an opening in the isolation dielectric. This opening can be deep enough to be expanded as the inverted trapezoidal opening. This is due to that the deep opening is formed by removing thick nitride cap embedded in the isolation dielectric. Therefore, the inverted trapezoidal epitaxial channel structure can be easily manufactured.

In some embodiments, a semiconductor device includes a substrate, an epitaxial channel structure and a gate structure. The epitaxial channel structure is located above the substrate. The epitaxial channel structure has a bottom and a top. The bottom is between the substrate and the top, and the bottom has a width less than that of the top.

In some embodiments, a semiconductor device includes a substrate, a semiconductor fin and a gate structure. The semiconductor fin includes a bottom portion and a tapered epitaxial portion atop the bottom portion. The bottom portion protrudes above the substrate. The tapered epitaxial portion tapers in a direction toward the bottom portion.

In some embodiments, a method of forming a semiconductor fin includes forming a semiconductor fin-shaped structure on a substrate, forming an isolation dielectric on the substrate, forming a tapered opening in the isolation dielectric to expose a top the semiconductor fin-shaped structure, wherein the tapered opening tapers in a direction toward the semiconductor fin-shaped structure, and filling the tapered opening with a semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a semiconductor fin protruding from the substrate;
   an epitaxial channel structure extending upwardly from a top surface of the semiconductor fin, wherein when viewed in a cross section taken along a direction perpendicular to a longitudinal axis of the semiconductor fin, the epitaxial channel structure is an inverted trapezoid;
   source/drain structures on opposite sides of the epitaxial channel structure;
   an isolation dielectric abutting the source/drain structure, wherein when viewed in the cross section taken along the direction perpendicular to the longitudinal axis of the semiconductor fin, an upper part of the isolation dielectric tapers in a direction away from the substrate and forms a first slanted interface with a lower part of a leg of the inverted trapezoid formed from the epitaxial channel structure; and
   a gate structure wrapping around the epitaxial channel structure, wherein the gate structure has a gate dielectric layer, and when viewed in the cross section taken along the direction perpendicular to the longitudinal axis of the semiconductor fin, the gate dielectric layer forms a second slanted interface with an upper part of the leg of the inverted trapezoid formed from the epitaxial channel structure, and the second slanted interface is coterminous with the first slanted interface.

2. The semiconductor device of claim 1, wherein the epitaxial channel structure tapers in a direction toward the substrate.

3. The semiconductor device of claim 1, wherein the semiconductor fin and the epitaxial channel structure respectively taper in opposite directions.

4. The semiconductor device of claim 1, wherein the gate structure has a recess receiving the epitaxial channel structure, and the recess tapers in a direction toward the substrate.

5. The semiconductor device of claim 1, wherein the gate structure comprises a plurality of inner sidewalls, the epitaxial channel structure is between the inner sidewalls, the inner sidewalls have bottom edges proximal to the substrate and top edges distal to the substrate, wherein a distance between the top edges is greater than that between the bottom edges.

6. The semiconductor device of claim 1, wherein the isolation dielectric defines an opening receiving at least a portion of the source/drain structure, wherein the opening has a shape of an inverted trapezoid.

7. The semiconductor device of claim 1, wherein the gate structure has a bottom above the bottom of the epitaxial channel structure.

8. The semiconductor device of claim 1, wherein the gate dielectric layer forms a horizontal interface with an upper base of the inverted trapezoid formed from the epitaxial channel structure when viewed in the cross section taken along the direction perpendicular to the longitudinal axis of the semiconductor fin.

9. The semiconductor device of claim 3, wherein the epitaxial channel structure and the semiconductor fin have different materials.

10. The semiconductor device of claim 3, wherein the epitaxial channel structure and the semiconductor fin have substantially the same material.

11. The semiconductor device of claim 4, wherein the recess of the gate structure has a shape of an inverted trapezoid.

12. A semiconductor device, comprising:
a substrate;
a semiconductor fin comprising a bottom portion and a tapered epitaxial portion atop the bottom portion, wherein the bottom portion protrudes above the substrate, and when viewed in a cross section taken along a direction perpendicular to a longitudinal axis of the semiconductor fin, the tapered epitaxial portion is an inverted trapezoid having a lower base, an upper base above and longer than the lower base, and two legs connecting the lower base and the upper base;
an isolation dielectric, wherein when viewed in the cross section taken along the direction perpendicular to the longitudinal axis of the semiconductor fin, the legs of the inverted trapezoid formed from the tapered epitaxial portion extend past a topmost surface of the isolation dielectric;
an embedded source/drain portion embedded in the isolation dielectric, wherein a lower part of the embedded source/drain portion tapers in the direction toward the bottom portion of the semiconductor fin; and
a gate structure, wherein the tapered epitaxial portion is embedded in the gate structure.

13. The semiconductor device of claim 12, wherein the gate structure has a gate dielectric, the gate dielectric has a recess, the tapered epitaxial portion is at least partially embeddedly retained in the recess, and the recess tapers in the direction toward the bottom portion.

14. The semiconductor device of claim 12, wherein the gate structure has a gate conductor, the gate conductor has a recess, the tapered epitaxial portion is at least partially embeddedly retained in the recess, and the recess tapers in the direction toward the bottom portion.

15. The semiconductor device of claim 12, further comprising an embedded portion between the embedded source/drain portion and the bottom portion of the semiconductor fin.

16. The semiconductor device of claim 12, wherein when viewed in the cross section taken along the direction perpendicular to the longitudinal axis of the semiconductor fin, the gate structure is in contact with upper parts of the legs of the inverted trapezoid formed from the tapered epitaxial portion.

17. A method of forming a semiconductor device, comprising:
forming a semiconductor fin-shaped structure on a substrate;
forming an isolation dielectric on the substrate;
forming a tapered opening in the isolation dielectric to expose a top the semiconductor fin-shaped structure, wherein the tapered opening tapers from a top surface of the isolation dielectric toward the semiconductor fin-shaped structure and wherein forming the tapered opening comprises:
forming an opening in the isolation dielectric using a first etchant; and
expanding the opening to form the tapered opening using a second etchant different from the first etchant; and
after forming the tapered opening, filling the tapered opening with a semiconductor material.

18. The method of claim 17, wherein forming the opening in the isolation dielectric comprises:
forming a cap atop the semiconductor fin-shaped structure before the forming the isolation dielectric, wherein the isolation dielectric is formed beside the cap; and
removing the cap to form the opening in the isolation dielectric, wherein the cap is formed with a thickness such that the opening is deep enough to be expanded as the tapered opening.

19. The method of claim 17, wherein filling the tapered opening comprises:
epitaxially growing a homoepitaxial or heteroepitaxial structure on the top of the semiconductor fin-shaped structure.

20. The method of claim 17, further comprising removing the semiconductor material such that a protruding portion of the semiconductor material remains in a gate structure.

* * * * *